United States Patent
Pandey et al.

(10) Patent No.: US 9,240,477 B2
(45) Date of Patent: Jan. 19, 2016

(54) TRANSISTOR-CONTAINING CONSTRUCTIONS AND MEMORY ARRAYS

(71) Applicant: Micron Technology, Inc., Boise, ID (US)

(72) Inventors: Deepak Pandey, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 14/189,808

(22) Filed: Feb. 25, 2014

(65) Prior Publication Data

US 2015/0243782 A1   Aug. 27, 2015

(51) Int. Cl.
*H01L 29/66*   (2006.01)
*H01L 29/78*   (2006.01)
*H01L 29/423*   (2006.01)
*H01L 27/108*   (2006.01)

(52) U.S. Cl.
CPC ...... *H01L 29/7827* (2013.01); *H01L 27/10805* (2013.01); *H01L 29/4236* (2013.01)

(58) Field of Classification Search
CPC ............ H01L 29/7827; H01L 29/4236; H01L 27/10805
USPC .......................................... 257/330, 396, 296
See application file for complete search history.

(56) References Cited

U.S. PATENT DOCUMENTS 5,510,630 A * 4/1996 Agarwal ............. H01L 21/8213
                                                                257/296
8,859,367 B2 * 10/2014 Mathew ............ H01L 29/42364
                                                                257/330

* cited by examiner

*Primary Examiner* — Tu-Tu Ho
(74) *Attorney, Agent, or Firm* — Wells St. John P.S.

(57) ABSTRACT

Some embodiments include transistor-containing constructions having gate material within an opening in a semiconductor material and spaced from the semiconductor material by gate dielectric material. The opening has a wide lower region beneath a narrow upper region. A saddle region of the gate dielectric material extends outwardly from a bottom of the opening and is along the semiconductor material beneath the opening. A saddle region of the gate material extends outwardly from the bottom of the opening and is along the gate dielectric material beneath the opening. Source/drain regions are within the semiconductor material along sides of the gate material. Some embodiments include memory arrays.

35 Claims, 6 Drawing Sheets

TRANSISTOR-CONTAINING CONSTRUCTIONS AND MEMORY ARRAYS

TECHNICAL FIELD

Transistor-containing constructions and memory arrays.

BACKGROUND

Transistors are commonly utilized in integrated circuits, and may have many applications throughout memory, logic, etc. For instance, transistors may be utilized in dynamic random access memory (DRAM) arrays. A DRAM unit cell may comprise a transistor in combination with a capacitor.

A continuing goal of integrated circuit fabrication is to create higher levels of integration, and accordingly to reduce size and spacing of existing components. It becomes increasingly more difficult to reduce the size of transistors due to short channel effects, higher contact resistance, and other complications.

Transistor performance may be characterized by numerous metrics, including, for example, current flow through the on state ($I_{on}$) of the transistor, and current flow through the off state ($I_{off}$) of the transistor. It is desired to have high $I_{on}$ with low $I_{off}$ so that current is controlled and relatively unimpeded when the transistor is in the on state, and so that there is low current flow, if any, in the off state. However, there may be some level of leakage through transistors, especially as the transistors become increasingly smaller. An example leakage mechanism is drain-induced barrier lowering (DIBL), which can be particularly problematic in transistors having short channels.

DETAILED DESCRIPTION OF THE ILLUSTRATED EMBODIMENTS

Some embodiments include new transistor configurations, logic, and/or memory arrays utilizing such configurations. Example embodiments are described below with reference to FIGS. 1-6.

Figure 1:
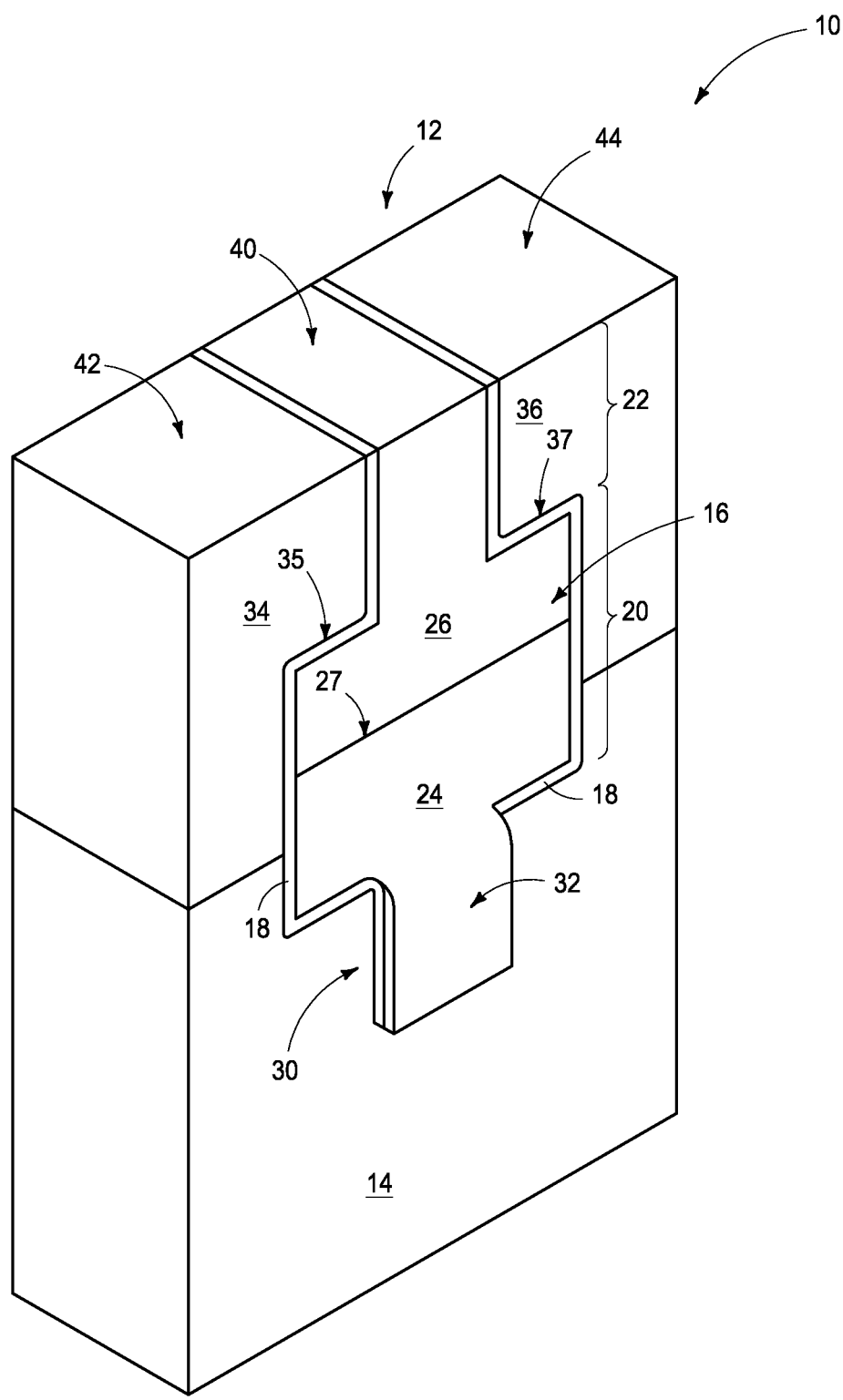
FIG. 1 is a three-dimensional view of an example embodiment transistor-containing construction.

Referring to FIG. 1, a construction 10 comprises an example embodiment transistor 12 extending into a semiconductor material 14. The material 14 may be any suitable semiconductor material; and in some embodiments may comprise, consist essentially of, or consist of monocrystalline silicon. The material 14 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, material 14 may be part of a semiconductor substrate containing one or more other materials associated with integrated circuit fabrication. Some of the other materials may be under the shown region of construction 10 and/or may be laterally adjacent the shown region of construction 10; and may correspond to, for example, one or more of refractory metal materials, barrier materials, diffusion materials, insulator materials, etc.

A recess 16 extends into the semiconductor material, and such recess is at least partially lined with gate dielectric material 18. The gate dielectric material may comprise any suitable composition or combination of compositions; and in some embodiments may comprise, consist essentially of, or consist of silicon dioxide and/or high-k materials (with high-k meaning a dielectric constant greater than that of silicon dioxide).

The recess 16 has a wide lower region 20 and a narrow upper region 22. In some embodiments, a width of the upper region may be less than or equal to about 75% of a width of the lower region, less than or equal to about 50% of the width of the lower region, etc.

Gate material 24 is within a bottom portion of the wide lower region 20, and insulative material 26 is over the gate material and directly contacts the gate material along an interface 27. The insulative material is within a top portion of the wide lower region 20, and is also within the narrow upper region 22. In some embodiments, material 26 may be omitted and gate material 24 may entirely fill both the lower region 20 and the upper region 22. Although the gate dielectric material extends along both of the materials 24 and 26 in the shown embodiment, in other embodiments the material 18 may only be along gate material 24 and may be omitted from being along material 26.

The gate material 24 may comprise any suitable electrically conductive composition, or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.).

The insulative material 26 may comprise any suitable composition or combination of compositions; and in some embodiments may comprise one or both of silicon dioxide and silicon nitride.

A portion of the gate dielectric material 18 extends outwardly from a bottom of recess 16 and along the semiconductor material beneath the recess to form a "saddle region" 30 of the dielectric material. Additionally, a portion of the gate material 24 extends outwardly from the bottom of recess 16 and along the dielectric material 18 to form a "saddle region" 32 of the gate material. In the shown embodiment, the saddle region 32 of gate material 24 exactly overlaps the saddle region 30 of dielectric material 18. In other embodiments, the dielectric material 18 may extend across a larger region than gate material 24; and accordingly saddle region 32 may be smaller than saddle region 30. The saddle regions may be relatively symmetric relative to the gate material in the recess 16 (as shown), or may be asymmetric relative to such gate material. Also, the saddle regions may extend vertically, or may extend along off-vertical axes.

Source/drain regions 34 and 36 extend within semiconductor material 14, and along sides of recess 16. The source/drain regions vertically overlap the interface 27 between insulative material 26 and gate material 24. In operation, a channel region extends between source/drain region 34 and source/drain region 36, and current across such channel region is gatedly controlled by electrical input to a transistor gate comprising material 24.

The source/drain regions 34 and 36 have steps 35 and 37, respectively, where the wide region 20 of recess 16 transitions to the narrow region 22. Conventional trenched transistors lack such steps and/or lack the saddle region 32. The combination of the steps and saddle region may enable trenched structure 12 to be formed to have similar $I_{off}$ as conventional devices, while having substantially improved $I_{on}$ (for instance, $I_{on}$ may be improved by 20%, 30%, 50% or more). Further, a narrow upper region 40 of the trenched structure 12 may enable wider upper contact surfaces 42 and 44 of source/drain regions 34 and 36 than would be available in comparable conventional devices.

Figure 2:
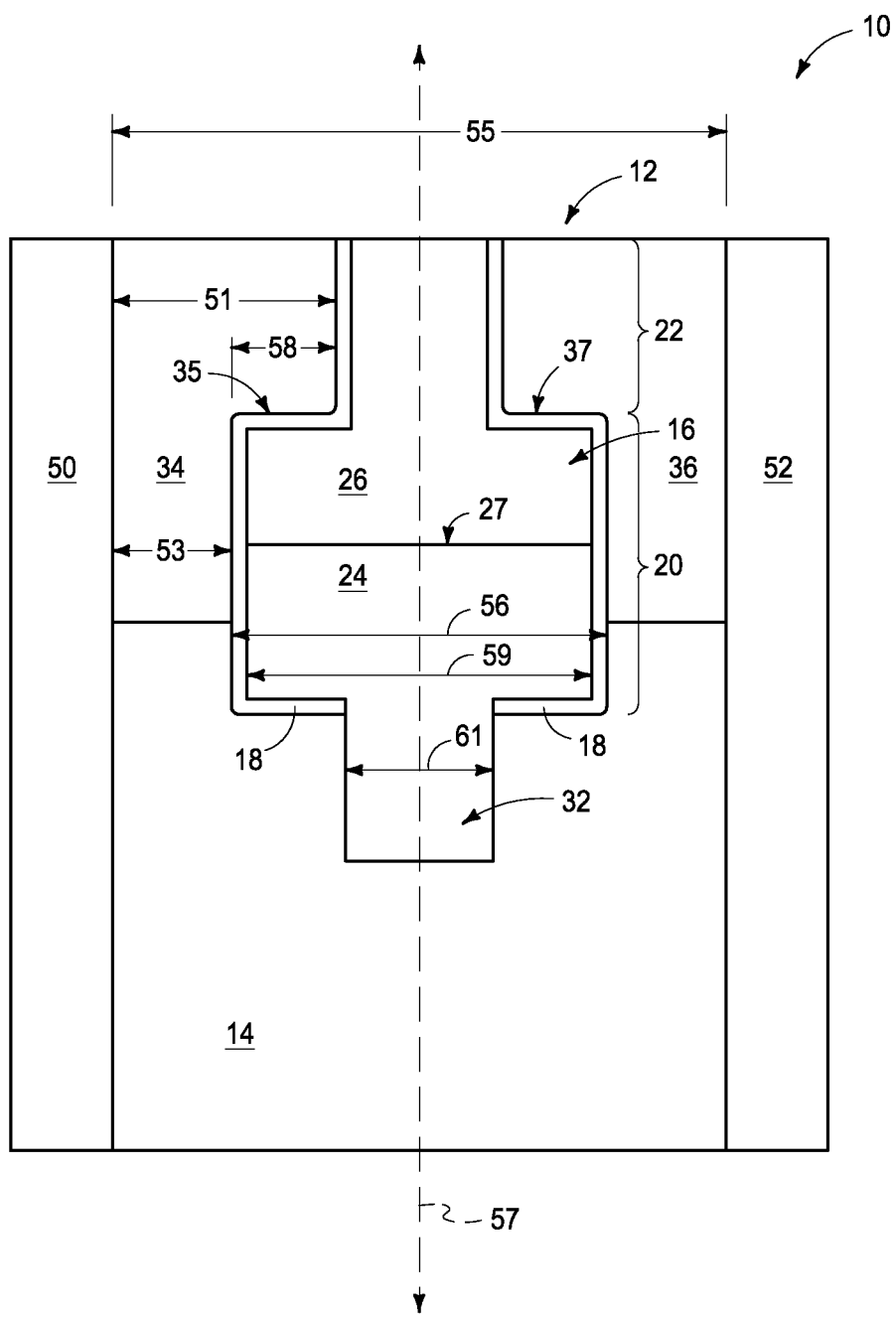
FIGS. 2-5 are cross-sectional side views of example embodiment transistor-containing constructions.

FIG. 2 shows a cross-sectional side view of the construction of FIG. 1, and additionally shows isolation regions 50 and 52 along edges of the construction. In some embodiments, the trenched structure 12 will be formed between a pair of isolation regions, as shown; and in other embodiments may be formed along only one isolation region (as discussed below with reference to FIG. 6), or may be formed in other configurations. The illustrated configuration having the trenched structure between a pair of isolation regions may be utilized in, for example, logic applications.

The source/drain region 34 is shown to have an upper region with a relatively large width 51, and a lower region with a relatively narrow width 53. A ratio of width 53 to width 51 may be, for example, from about 0.1 to about 0.8; and in some embodiments may be from about 0.3 to about 0.5. In some example embodiments, width 53 may be less than or equal to about one-half of width 51. The width 53 may be any suitable width, and in some embodiments may be less than or equal to about 5 nm. The width 51 may be any suitable width, and in some embodiments may be less than or equal to about 20 nm, less than or equal to about 10 nm, within a range of from about 3 nm to about 10 nm, within a range of from about 1 nm to about 10 nm, etc.

Wide region 20 of recess 16 is shown having a width 56. In some embodiments, such width may be less than or equal to about 80 nanometers. The step 35 has a width 58. In some embodiments, the width 58 may be within a range of from about 3% of width 56 to about 15% of width 56; and in some embodiments may be within a range of from about 10% to about 95% of the width 51.

The trenched transistor structure 12 has an overall width 55 between isolation regions 50 and 52 along the cross-section of FIG. 2. In some embodiments, such overall width may be less or equal to about 120 nm.

A plane 57 is shown extending vertically along a center of recess 16 (or, in other words, vertically along a center of materials 24 and 26). In the shown embodiment, structure 12 substantially has mirror symmetry relative to such plane; and specifically, step 37 is about the same size as step 35. The term "substantially" is utilized to indicate that structure 12 has mirror symmetry to within reasonable tolerances of fabrication and measurement. Although the illustrated trenched structure extends vertically (or at least substantially vertically), in other embodiments the trenched structure may extend along an off-vertical axis; and in such other embodiments the plane 57 that bisects the trenched structure may be along an off-vertical axis.

Figure 3:
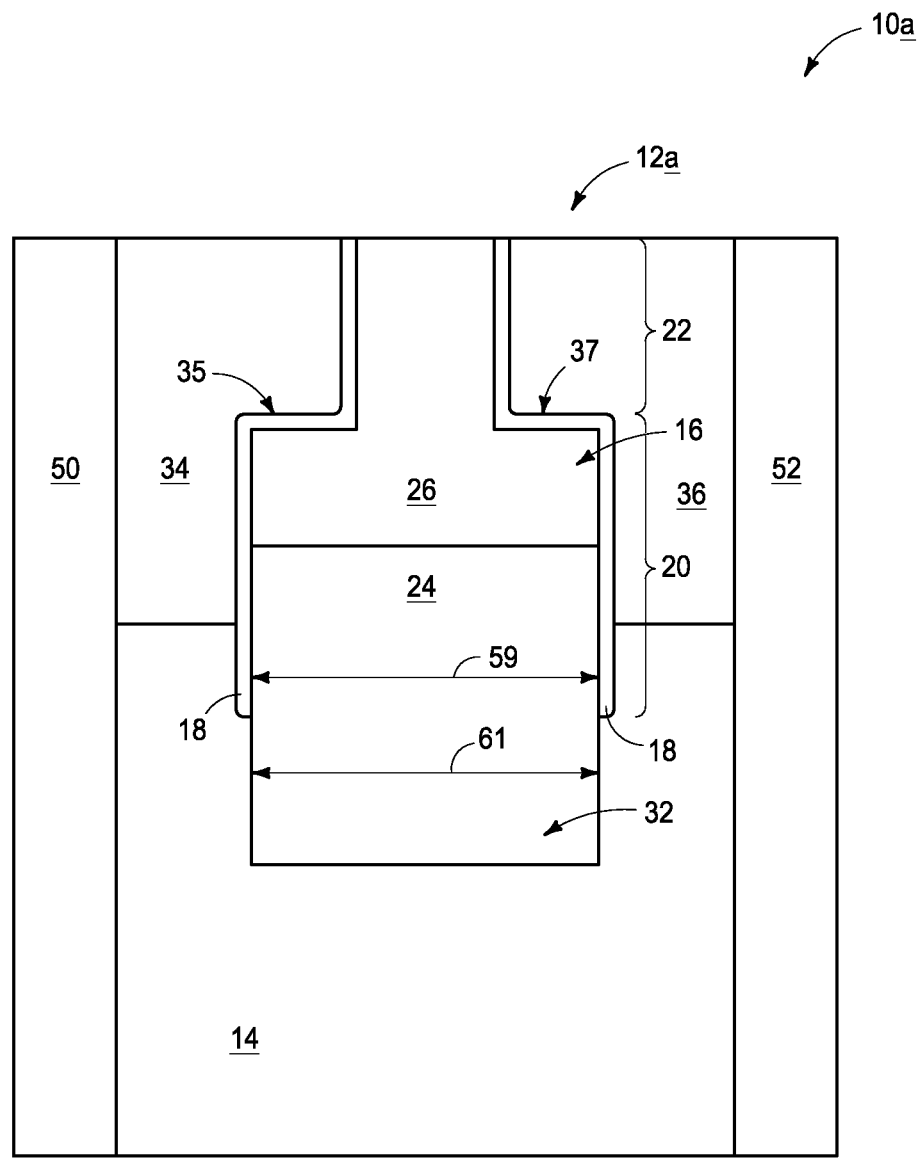

A region of conductive material 24 within recess 16 may be part of a wordline that extends in and out of the page relative to the cross-section of FIG. 2. Such wordline has a width 59. The saddle region 32 has a width 61, which may be less than or equal to the width 59 of the wordline. In some embodiments, the width 61 may be less than or equal to about 75% of the width 59, less than or equal to about 50% of the width 59, etc. FIG. 3 shows a construction 10a comprising an example embodiment transistor 12a in which width 61 of saddle region 32 is substantially the same as width 59 of the wordline within recess 16.

In the embodiment of FIG. 2, the narrow region 22 of recess 16 is inset relative to the wide region 20 by substantially equal steps 35 and 37 that are on opposing sides of the narrow region along the illustrated cross-section. Accordingly, there is substantial mirror symmetry relative to plane 57. In other embodiments, structures analogous to structure 12 may be asymmetric relative to plane 57. Examples of such other embodiments are described with reference to FIGS. 4 and 5.

Figure 4:
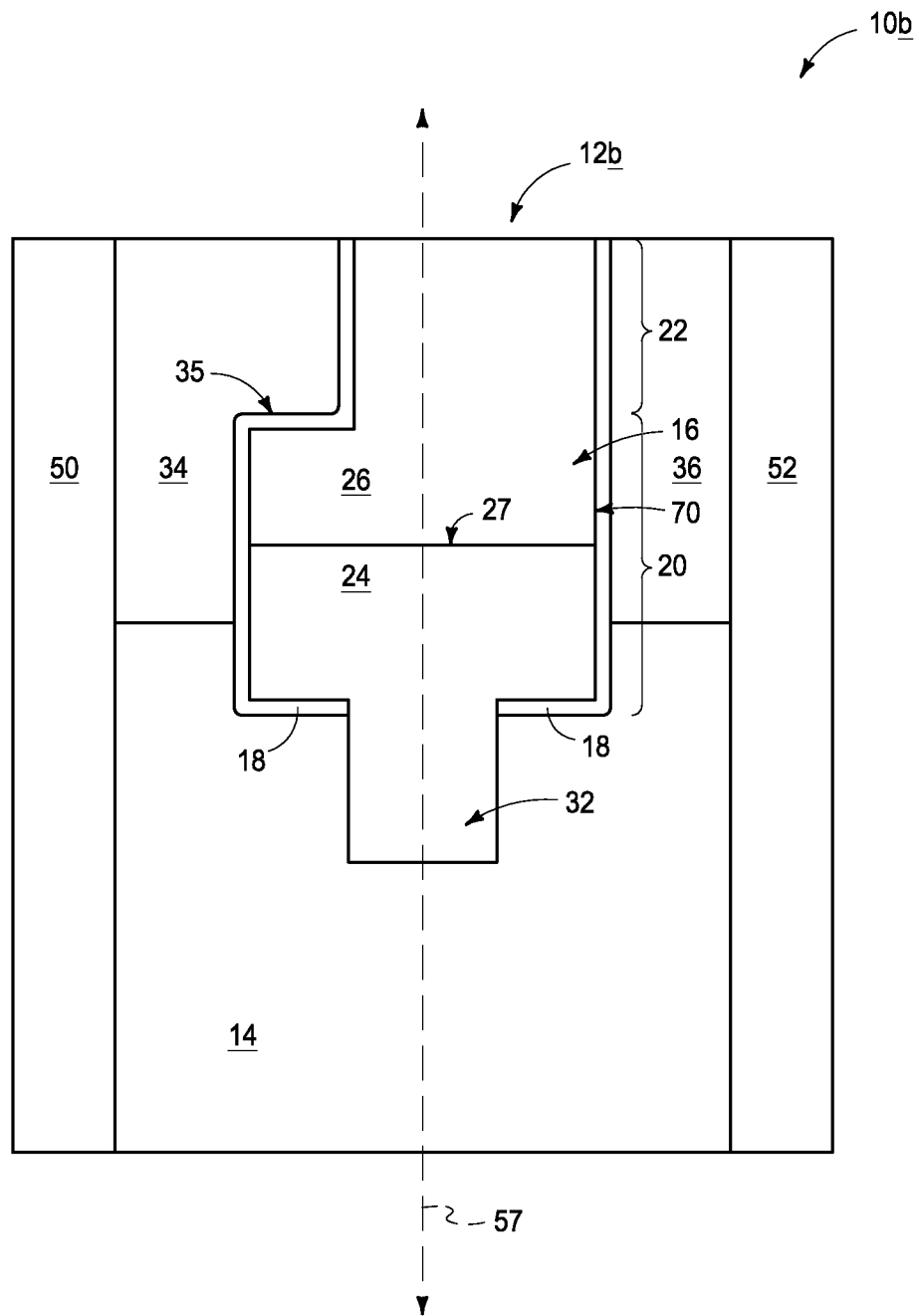

Referring to FIG. 4, a construction 10b comprises a recessed structure 12b having only one step 35. The step 37 (FIG. 2) is missing, and instead a substantially vertical sidewall 70 extends along an entirety of one side of recess 16 (i.e., along both the narrow upper region 22 and wide lower region 20 of the recess).

Figure 5:
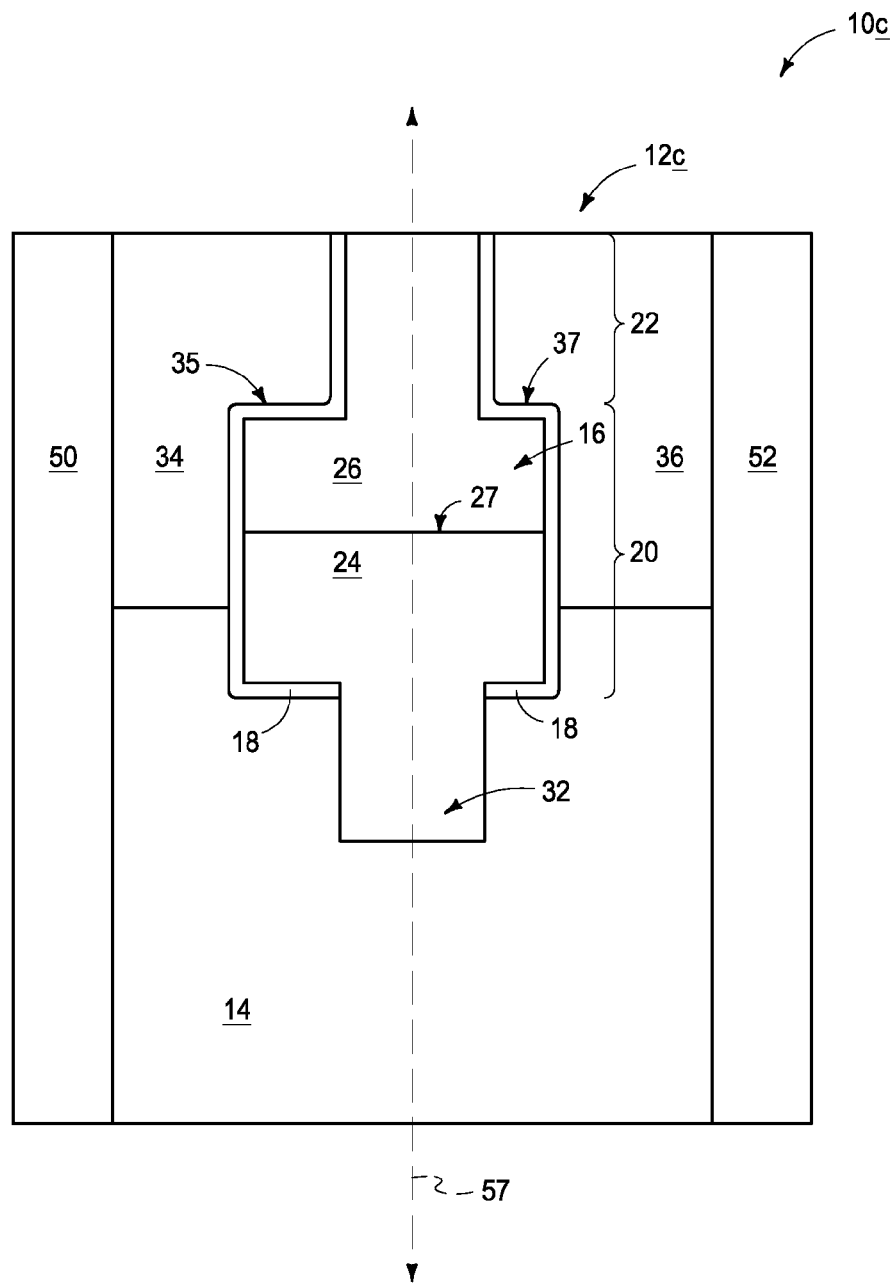

FIG. 5 shows a construction 10c comprising a recessed structure 12c having steps 35 and 37 which are of different widths relative to one another.

The asymmetric configurations of FIGS. 4 and 5 may be advantageous in applications in which space limitations or fabrication limitations render it difficult to form a truly symmetric device; and/or may be advantageous in applications in which it is desired to fabricate a transistor device which is asymmetric relative to current flow relative to the paired source/drain regions.

Figure 6:
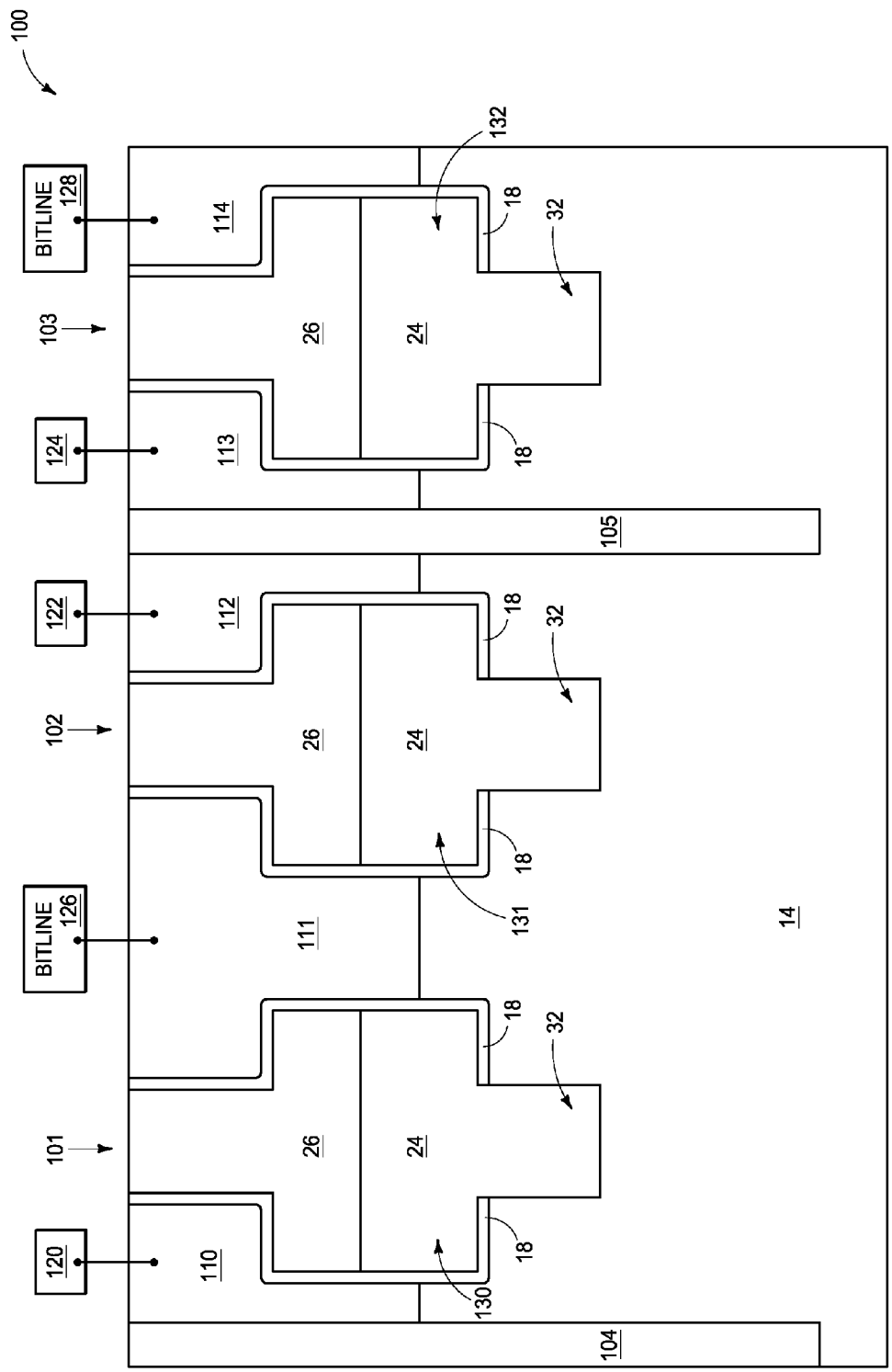
FIG. 6 is a cross-sectional side view of example embodiment memory array.

The recessed transistors of FIGS. 1-5 may be utilized in any of numerous applications, and may be, for example, utilized as field effect transistors in logic applications and/or memory applications. FIG. 6 shows an example embodiment memory array 100 in which recessed transistors of the type described above with reference to FIG. 2 are utilized in a DRAM application.

A plurality of trenched transistors 100-103 are comprised by the array. Such transistors are identical to a structure described above with reference to FIG. 2. The transistors may be examples of a large number of transistors formed along rows and columns of the array.

The transistors comprise source/drain regions 110-114; with region 111 being shared between devices 101 and 102.

Isolation regions 104 and 105 extend into semiconductor material 14, and separate some of the adjacent source/drain regions from one another.

Memory structures 120, 122 and 124 are electrically coupled to source/drain regions 110, 112 and 113, respectively; and bitlines 126 and 128 are electrically coupled to source/drain regions 111 and 114, respectively.

The gate material 24 within each of the transistors is coupled with a wordline 130-132; with the wordlines extending in and out of the page relative to the shown cross-sectional view.

The memory structures 120, 122 and 124 may comprise any suitable structures. For instance, in DRAM the memory structures may comprise charge-storage devices such as, for example, capacitors. In operation, the combination of a capacitor with a transistor may form a memory unit, and each memory unit may be uniquely addressed through the combination of a wordline and a bitline.

The constructions described above may be fabricated with any suitable methodology. For instance, in some embodiments recesses 16 of FIGS. 1-6 may be fabricated utilizing multiple etches, in which one of the etches is isotropic and utilized to fabricate the lower wide portions of the recesses, and another etch is anisotropic and utilized to fabricate the narrow upper portions of the recesses.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a transistor-containing construction. The construction comprises a recess extending into a semiconductor material, with the recess having a narrow upper region and a wide lower region. Gate dielectric material is along the wide lower region of the recess. Gate material is within a bottom portion of the wide lower region. The gate dielectric material extends outwardly from a bottom of the recess and is along the semiconductor material beneath the recess. Gate material extends outwardly from the bottom of the recess and is along the gate dielectric material beneath the recess. Source/drain regions are within the semiconductor material along sides of the recess. The source/drain regions vertically overlap the interface of the insulative material and the gate material.

Some embodiments include a transistor-containing construction. The construction comprises gate material within an opening in a semiconductor material, and spaced from the semiconductor material by gate dielectric material. Insulative material is over the gate material and directly contacts the gate material along an interface. The insulative material is within the opening. The insulative material has a narrow section over a wide section. The wide section has a same width as the gate material. A saddle region of the gate dielectric material extends outwardly from a bottom of the opening and is along the semiconductor material beneath the opening. A saddle region of the gate material extends outwardly from the bottom of the opening and is along the gate dielectric material beneath the opening. Source/drain regions are within the semiconductor material along sides of the electrically insulative material and gate material. The source/drain regions vertically overlap the interface of the insulative material and the gate material.

Some embodiments include a memory array. The memory array includes a plurality of transistor constructions within a semiconductor material. Each transistor construction comprises gate material within an opening in the semiconductor material, and spaced from the semiconductor material by gate dielectric material. The gate material within the opening is part of a wordline. Each transistor construction comprises insulative material over the gate material and directly contacting the gate material along an interface. The insulative material is within the opening. The insulative material has a narrow section over a wide section. The wide section has a same width as the gate material. Each transistor construction comprises a saddle region of the gate dielectric material extending outwardly from a bottom of the opening and along the semiconductor material beneath the opening. Each transistor construction comprises a saddle region of the gate material extending outwardly from the bottom of the opening and along the gate dielectric material beneath the opening. Each transistor construction comprises source/drain regions within the semiconductor material along sides of the electrically insulative material and gate material. The source/drain regions vertically overlap the interface of the insulative material and the gate material. The memory array includes a pair of adjacent transistor constructions sharing a source/drain region. The shared source/drain region is connected to a bitline. The adjacent transistor constructions also comprise source/drain regions which are not shared, and which are connected to memory structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A transistor-containing construction, comprising:
    a recess extending into a semiconductor material; the recess having a narrow upper region and a wide lower region;
    gate dielectric material along the wide lower region of the recess;
    gate material within a bottom portion of the wide lower region;
    gate dielectric material extending outwardly from a bottom of the recess and along the semiconductor material beneath the recess;
    gate material extending outwardly from the bottom of the recess and along the gate dielectric material beneath the recess; and
    source/drain regions within the semiconductor material along sides of the recess.

2. The construction of claim 1 wherein the gate dielectric is along the narrow upper region of the recess.

3. The construction of claim 1 wherein the gate material is within both the narrow upper region of the recess and the wide lower region of the recess.

4. The construction of claim 1 wherein insulative material is over the gate material within the recess and directly contacts the gate material along an interface; the insulative material being within a top portion of the wide lower region, and being within the narrow upper region; the source/drain regions vertically overlapping the interface of the insulative material and the gate material.

5. The construction of claim 4 wherein the gate material within the recess is comprised by a wordline extending through the recess; wherein the gate material extending outwardly from the bottom of the recess forms a saddle region along the semiconductor material; and wherein said saddle region has a width about the same as a width of the wordline.

6. The construction of claim 4 wherein the gate material within the recess is comprised by a wordline extending through the recess; wherein the gate material extending outwardly from the bottom of the recess forms a saddle region along the semiconductor material; and wherein said saddle region has a width less than a width of the wordline.

7. The construction of claim 4 wherein the gate material within the recess is comprised by a wordline extending through the recess; wherein the gate material extending outwardly from the bottom of the recess forms a saddle region along the semiconductor material; and wherein said saddle region has a width less than or equal to about one-half of a width of the wordline.

8. The construction of claim 4 wherein the recess substantially has mirror symmetry along a plane extending vertically along a center of the recess.

9. The construction of claim 4 wherein the recess does not have mirror symmetry along a plane extending vertically along a center of the recess.

10. The construction of claim 9 wherein one side of the recess has a substantially vertical sidewall extending along both the narrow upper region and the wide lower region.

11. The construction of claim 4 wherein the narrow upper region is inset relative to the wide lower region by a step along one side of the recess.

12. The construction of claim 11 wherein the wide lower region has a first width and wherein the step has a second width within a range of from about 3% of the first width to about 15% of the first width.

13. The construction of claim 11 wherein one of the source/drain regions has a first width adjacent the narrow upper region of the recess; and wherein the step has a second width within a range of from about 10% of the first width to about 95% of the first width.

14. The construction of claim 11 wherein the wide lower region has a width of no greater than about 80 nanometers and wherein the step has a width within a range of from about 3 nanometers to about 10 nanometers.

15. The construction of claim 11 wherein the step is a first step, and further comprising a second step on an opposing side of the narrow upper region from the first step.

16. The construction of claim 15 wherein the first and second steps have substantially identical widths relative to one another.

17. The construction of claim 15 wherein the first and second steps have different widths relative to one another.

18. A transistor-containing construction, comprising:
gate material within an opening in a semiconductor material, and spaced from the semiconductor material by gate dielectric material;
insulative material over the gate material and directly contacting the gate material along an interface, the insulative material being within the opening; the insulative material having a narrow section over a wide section; the wide section having a same width as the gate material;
a saddle region of the gate dielectric material extending outwardly from a bottom of the opening and along the semiconductor material beneath the opening;
a saddle region of the gate material extending outwardly from the bottom of the opening and along the gate dielectric material beneath the opening; and
source/drain regions within the semiconductor material along sides of the electrically insulative material and gate material, the source/drain regions vertically overlapping the interface of the insulative material and the gate material.

19. The construction of claim 18 wherein the gate material within the opening has a first width; and wherein the saddle region gate material has a second width which is about the same as the first width.

20. The construction of claim 18 wherein the gate material within the opening has a first width; and wherein the saddle region gate material has a second width which is less than the first width.

21. The construction of claim 20 wherein the second width is less than or equal to about 75% of the first width.

22. The construction of claim 20 wherein the second width is less than or equal to about 50% of the first width.

23. The construction of claim 18 wherein the insulative material and the gate material substantially have mirror symmetry along a plane extending vertically along a center through the insulative material and the gate material.

24. The construction of claim 18 wherein the insulative material and the gate material do not have mirror symmetry along a plane extending vertically along a center through the insulative material and the gate material.

25. The construction of claim 18 wherein the narrow section of the insulative material is inset relative to the wide section by a step along one side of the insulative material.

26. The construction of claim 25 wherein the wide section has a first width and wherein the step has a second width within a range of from about 3% of the first width to about 15% of the first width.

27. The construction of claim 25 wherein the step is a first step, and further comprising a second step on an opposing side of the narrow section from the first step.

28. A memory array, comprising:
a plurality of transistor constructions within a semiconductor material; each transistor construction comprising:
gate material within an opening in the semiconductor material, and spaced from the semiconductor material by gate dielectric material; the gate material within the opening being part of a wordline;
insulative material over the gate material and directly contacting the gate material along an interface, the insulative material being within the opening; the insulative material having a narrow section over a wide section; the wide section having a same width as the gate material;
a saddle region of the gate dielectric material extending outwardly from a bottom of the opening and along the semiconductor material beneath the opening;

a saddle region of the gate material extending outwardly from the bottom of the opening and along the gate dielectric material beneath the opening; and source/drain regions within the semiconductor material along sides of the electrically insulative material and gate material, the source/drain regions vertically overlapping the interface of the insulative material and the gate material; and a pair of adjacent transistor constructions sharing a source/drain region; the shared source/drain region being connected to a bitline; the adjacent transistor constructions also comprising source/drain regions which are not shared, and which are connected to memory structures.

29. The memory array of claim 28 wherein the memory structures are capacitors.

30. The memory array of claim 28 wherein an individual transistor construction has gate material within the opening having a first width; and has saddle region gate material having a second width which is about the same as the first width.

31. The memory array of claim 28 wherein an individual transistor construction has gate material within the opening having a first width; and has saddle region gate material having a second width which is less than the first width.

32. The memory array of claim 31 wherein the second width is less than or equal to about 75% of the first width.

33. The memory array of claim 31 wherein the second width is less than or equal to about 50% of the first width.

34. The memory array of claim 28 wherein an individual transistor construction has insulative material and gate material substantially having mirror symmetry along a plane extending vertically along a center through the insulative material and the gate material.

35. The memory array of claim 28 wherein an individual transistor construction has insulative material and gate material that do not have mirror symmetry along a plane extending vertically along a center through the insulative material and the gate material.

* * * * *